United States Patent [19]
Miwa

[11] Patent Number: 6,043,554
[45] Date of Patent: Mar. 28, 2000

[54] BIPOLAR TRANSISTOR AND ITS MANUFACTURING METHOD

[75] Inventor: Hiroyuki Miwa, Kanagawa, Japan

[73] Assignee: Sony Corporation, Tokyo, Japan

[21] Appl. No.: 08/788,199

[22] Filed: Jan. 24, 1997

[30] Foreign Application Priority Data

Jan. 25, 1996 [JP] Japan .................................. 8-010582
Feb. 14, 1996 [JP] Japan .................................. 8-026341

[51] Int. Cl.[7] .............................................. H01L 27/082
[52] U.S. Cl. ........................................... 257/588; 257/592
[58] Field of Search ................................. 257/588, 592, 257/616

[56] References Cited

U.S. PATENT DOCUMENTS 5,789,800   8/1998   Kohno ...................................... 257/588

*Primary Examiner*—Mark V. Prenty
*Attorney, Agent, or Firm*—Hill & Simpson

[57] ABSTRACT

A p+ type graft base layer is formed both in a base layer of a p type epitaxial layer in a base opening of an insulating layer formed on a collector layer of an n type epitaxial layer and on an upper layer of the n type epitaxial layer contacting the p type epitaxial layer so that the graft base layer is positioned near the edge of the base opening, whereby a pn junction is formed away from the edge of the base opening where crystallinity of the p type epitaxial layer is deteriorated.

9 Claims, 8 Drawing Sheets

BIPOLAR TRANSISTOR AND ITS MANUFACTURING METHOD

BACKGROUND OF THE INVENTION

This invention relates to a bipolar transistor and its manufacturing method.

Now that larger-size and higher performance LSIs are demanded more and more performance of bipolar transistors is also demanded to be more enhanced These days.

In order to meet such a demand for bipolar transistors, the base width of the target bipolar transistor has been narrowed to shorten the base transit time, the base resistance has been reduced, and the parasitic capacity represented by the capacity formed between base and collector has been reduced.

In a bipolar transistor adopting a so-called double polysilicon structure in which the emitter output electrode and the base output electrode are made of 2-layer polysilicon, each emitter output electrode is separated from each base output electrode by a side wall insulating film to reduce the base-collector capacity significantly.

Furthermore, in order to shorten the base transit time, a shallow base junction has been materialized to reduce the base width by low energy ion implantation technology.

Furthermore, recently, another technology for forming the base layer by epitaxial technology (so-called Epi-Base technology) was proposed to reduce both the base width and the base resistance simultaneously.

Hereunder, an embodiment of a double polysilicon structure bipolar transistor that uses the Epi-Base technology will be described briefly with reference to FIG. 1A through FIG. 1D. The transistor was disclosed in Japanese Patent Laid Open No.159726/1990.

As shown in FIG. 1A, an n+ type embedded layer 212 is formed on a P type silicon substrate 211, and an n type epitaxial layer 213 is formed above the p type silicon substrate 211.

After this, a so-called trench-like element separating area 214 is formed in the n type epitaxial layer 213 by selective non-isotropic etching and embedding technology of insulating film. This element separating area 214 separates an element forming area 215 from others. In the deep element separating area 214 is embedded a polysilicon layer 216 as shown in FIG. 1A. Then, an n+ type collector output diffusion layer 241 is formed and connected to the n+ type embedded layer 212.

Subsequently, an oxidized silicon film 217 is formed on the entire surface of the n type epitaxial layer 213 using the Chemical Vapor Deposition (CVD) method.

After this, the oxidized silicon film 217 is removed from the element forming area 215 by lithographic technology and by etching technology to form first opening 218.

The resist mask (not illustrated) formed by lithographic technology is removed after the etching is ended. Hereafter, in the same process, each resist mask is regarded to be removed after etching is ended.

Subsequently, an epitaxial layer 219 to be used as a p type semiconductor layer is formed inside the first opening 218 by selective epitaxial growth. This epitaxial layer 219 is made of, for example, silicon (Si), germanium (Ge), silicon germanium ($Si_{1-x}Ge_x$), and the like into which P type impurities such as boron (B) are implanted.

When oxidized silicon is used for the insulating film, the surfaces of both the p type epitaxial layer 219 and the oxidized silicon film 217 can be almost flattened if the insulating film is formed selectively only on the n type epitaxial layer 213. In this case, the insulating film does not make any epitaxial growth on the oxidized silicon film in the epitaxial growth process.

On the other hand, if a p type epitaxial layer 219 is formed on the oxidized silicon film 217, a single crystal layer is formed on the n type epitaxial layer 213 and a poly-crystal layer is formed on the oxidized silicon film 217. FIG. 1A shows such a case in which a poly-crystal layer is formed.

After this, as shown in FIG. 1B, an insulating film 220 of oxidized silicon film is formed all over the surface with the CVD method.

Then, second opening 221 is formed on the insulating film 220 by lithographic technology and by etching technology so that the opening may be positioned on the p type epitaxial layer 219. At the bottom of this second opening 221 is thus exposed the end of the p type epitaxial layer 219 by a width of $L_1$. The second opening 221 is formed so that part of it may overlap with the element separating area 214 in the top view of the substrate.

Consequently, the surface of the p type epitaxial layer 219 is exposed at the bottom of the second opening 221 by a width of $L_1$.

Subsequently, a polysilicon layer 222 is formed on the entire surface of the object with the CVD method. This polysilicon layer 222 functions as a base output electrode and covers the insulating film 220 on which the second opening 221 is formed. Especially, the polysilicon layer 222 is connected to the surface of the p type epitaxial layer 219 at the bottom of the second opening 221.

Ion implantation can also be used for doping for the polysilicon layer 222.

After this, a resist mask is formed by lithographic technology and the mask is used for dry-etching for patterning the polysilicon layer 222.

The patterned polysilicon layer 222 is then covered by forming an oxidized silicon layer 223.

Then, a resist layer 225 is formed by lithographic technology, and an opening 226 is formed on the resist layer 225. The opening 226 is formed in the upper portion inside the insulating film 220 formed above the p type epitaxial layer 219. For example, the opening inside the insulating film 220 is away from the edge of the second opening 221 by a width of $L_2$.

Subsequently, as shown in FIG. 1C, third opening 224 is formed by non-isotropic etching (reactive ion etching) using the resist layer 225 as a mask so that the opening may go through the insulating film 223, the polysilicon layer 222, and the insulating film 220. This third opening 224 is formed by copying the shape of the opening 226.

After this, ion implantation is performed to form an n+ type deep impurity area 242 near the boundary between the n type embedded layer 212 and the n type epitaxial layer 213 formed under the p type epitaxial layer 219.

Subsequently, an oxidized silicon film is formed all over the impurity area 242 with the CVD method to form a side wall insulating film. Then, the oxidized silicon film is etched back to form a side wall insulating film 227 on the side wall of the third opening 224. The side wall insulating film 227 is also used as a side wall insulating film.

After this, as shown in FIG. 1D, a thin polysilicon layer 228 is formed on the side wall of the side wall insulating film 227 with the CVD method, for example. Then, n type impurities are ion-implanted in the polysilicon layer 228, then an emitter layer 230 is formed by diffusion of impurities from the polysilicon layer 228.

In the thermal treatment performed at this time, a graft base layer 229 is also formed together by diffusion of impurities from the polysilicon layer 222. The polysilicon layer 228 functions as an emitter lead electrode.

Hereafter, no illustration will be used for explaining the subsequent processes.

At first, contact holes are formed to output signals from collector and base, then base electrodes, emitter electrodes, and collector electrodes are formed to finish the manufacturing of the target bipolar transistor.

However, there are still many problems that cannot be solved by the prior art technologies described above. Hereunder, therefore, the problems that this invention is to solve will be explained using the codes given to the configuration items in FIG. 1A through FIG. 1D for explaining the prior art technologies.

In other words, when forming a p type epitaxial layer 219 used as a base layer in an epitaxial growth process, a problem arises from the crystallinity property of the epitaxial layer 219. The epitaxial layer 219 formed by selective epitaxial growth deteriorates the crystallinity at the edge of the first opening 218. Thus, a large current leaks from the pn junction formed at this portion.

Consequently, the pn junction must avoid the end of the epitaxial layer 219 and this becomes a restriction for forming elements.

Concretely, a certain distance must be secured between a junction between a graft base layer 229 and an N type epitaxial layer 213 used as a collector area, and the edge of the first opening 218 when the graft base 229 is to be formed. And for this purpose, the diffusion depth of the graft base layer 219 had to be larger than the film thickness of the P type epitaxial layer 219.

However, since the graft base layer 229 was formed by diffusion of impurities from the polysilicon layer 222, a high temperature thermal treatment was needed for forming a diffusion layer deeper than the film thickness of the P type epitaxial layer 219. For example, if the P type epitaxial layer 219 has a film thickness of 50 to 100 nm, a thermal treatment of 10 to 30 minutes had to be performed at 900° C. so as to form a graft base layer having a diffusion depth of 100 to 200 nm. If such a thermal treatment is performed, however, impurities in the base layer [P type epitaxial layer 219] are also diffused at the same time. This was why the merit of a shallow junction base formed in an epitaxial growth process was lost.

The object of this invention is thus to provide a high performance bipolar transistor with excellent characteristics by preventing epitaxial layers from current leaking without disturbing the shallow junction base layer formed in an epitaxial growth process, as well as to provide a manufacturing method for such transistors.

SUMMARY OF THE INVENTION

To achieve the purpose described above, a first type bipolar transistor according to this invention is provided as comprising a first semiconductor layer of first conduction type used as a collector a first insulating film formed on the first semiconductor layer and provided with a base opening in an area where a base layer is formed an epitaxial layer of second conduction type formed both inside the base opening and on the first insulating film, which epitaxial layer is a base layer inside the base opening and a base output electrode on the first insulating film an offset insulating film pattern formed on the epitaxial layer in the base opening, away from the edge of the base opening a graft base layer of second conduction type formed both in the epitaxial layer and on the first semiconductor layer near the edge of the base opening a second insulating film formed to cover the epitaxial layer and the offset insulating film pattern an emitter opening formed so that it reaches the surface of the epitaxial layer through both the second insulating film and the offset insulating film pattern a n emitter output electrode of first conduction type formed in the emitter opening so as to be connected to the epitaxial layer and an emitter layer of first conduction type formed on an upper layer of the epitaxial layer to which the emitter output electrode is connected.

Furthermore, a dummy pattern comprising an insulating film can be formed on the first insulating film around the base output electrode made of the epitaxial layer.

In the first type bipolar transistor having the above configuration, the graft base layer is formed to be positioned both on the epitaxial layer near the edge of the base opening and on the first semiconductor layer. Thus, the pn junction between the graft base layer and the first semiconductor layer is separated from the base opening. This is why it can be avoided to arrange a pn junction in an area where crystallinity of the epitaxial layer is deteriorated, since graft base is formed there. This makes it possible to form a pn junction in an area where good crystallinity is assured for the epitaxial layer.

Furthermore, in a configuration where a dummy pattern is formed, the surface of the second insulating film is flattened. Thus, multiple-layer wiring can be made easily on the second insulating film.

The first manufacturing method of a bipolar transistor according to the invention is for the above described first type bipolar transistor and comprises four processes.

The first process comprises the steps of forming a first insulating film on a first semiconductor layer of first conduction type used as a collector, forming a base opening in the first insulating film formed on the first semiconductor layer, and forming an epitaxial layer of second conduction type both inside the base opening and on the first insulating film and the epitaxial layer is a base layer inside the base opening and a base output electrode on the first insulating film.

The second process comprises steps of forming an offset insulating film pattern on the epitaxial layer in the base opening, away from the edge of the base opening by a specified distance, and forming a graft base layer of second conduction type both on the epitaxial layer and on an upper layer of the first semiconductor layer.

The third process comprises the steps of forming a second insulating film to cover the epitaxial layer and the offset insulating film pattern, and forming an emitter opening reaching the surface of the epitaxial layer through both the second insulating film and the offset insulating film pattern.

The fourth process comprises the steps of forming a conductive layer containing impurities of first conduction type in the emitter opening, and forming an emitter layer by diffusing the impurities of first conduction type into an upper layer of the epitaxial layer from the conductive layer by a diffusion processing.

In the above first method, the graft base layer is formed by implanting second conduction type impurities into the epitaxial layer and the first semiconductor layer by ion implantation using the offset insulating film pattern as a mask, so the graft base is formed so that it may be positioned both on the epitaxial layer near the edge of the base opening and on the first semiconductor layer. Thus, the graft base layer is formed at a portion near the edge of the base opening, where crystallinity of the epitaxial layer is deteriorated, and the junction between the graft base layer and the first semiconductor layer is separated from the base opening.

Furthermore, when forming the offset insulating film pattern, a dummy pattern of an insulating film may be formed on the first oxidized film around the base output electrode formed by patterning the epitaxial layer on the first insulating film. In this case, the difference in level formed by the base output electrode is lowered, so that the surface of second insulating film to be formed later is flattened. As a result, multiple-layer wiring can be easily formed on the second insulating film.

The second manufacturing method according to the invention is also for the above described first type bipolar transistor and comprises four processes.

The first process comprises the steps of forming a first insulating film on a first semiconductor layer of first conduction type used as a collector, forming a base opening in the first insulating film formed on the first semiconductor layer, and forming an epitaxial layer of second conduction type both inside the base opening and on the first insulating film and the epitaxial layer is a base layer inside the base opening and a base output electrode on the first insulating film.

The second process comprises the steps of forming a pattern on the epitaxial layer, away from the edge of the base opening by a specified distance, and forming a graft base layer of second conduction type both on the epitaxial layer and on an upper layer of the first semiconductor layer.

The third process comprises the steps of removing the pattern, forming a second insulating film to cover the epitaxial layer, and forming an emitter opening reaching the surface of the epitaxial layer through the second insulating film.

The fourth process comprises the steps of forming a conductive layer containing impurities of first conduction type in the emitter opening, and forming an emitter layer by diffusing the impurities of first conduction type into an upper layer of the epitaxial layer from the conductive layer by a diffusion processing.

In the above second manufacturing method, the graft base layer is formed by implanting second conduction type impurities into both the epitaxial layer and the first semiconductor layer by ion implantation using the pattern formed on the epitaxial layer inside the base opening as a mask, so the graft base layer is formed to be positioned both on the epitaxial layer near the edge of the base layer and on the first semiconductor layer. This makes it possible to form the graft base layer near the edge of the base opening, where crystallinity of the epitaxial layer is deteriorated and separate the junction between the graft base layer and the first semiconductor layer from the base opening.

Hereunder, a second type bipolar transistor of this invention will be described.

The second type bipolar transistor according to the invention comprises a first semiconductor layer of first conduction type used as a collector, a first insulating film formed on the first semiconductor layer and provided with a base opening in an area where a base layer is formed, an epitaxial layer of second conduction type formed at least in the base opening for being a base layer, an offset insulating film pattern formed on the epitaxial layer, away from the edge of the base opening by a specified distance toward the inside of the base opening, a second semiconductor layer of second conduction type formed so that it is connected at least to the epitaxial layer on the side of the offset insulating film pattern, a graft base layer of second conduction type formed both in the epitaxial layer and on the first semiconductor layer near the edge of the base opening, a second insulating film formed to cover the second semiconductor layer, an emitter opening formed so that it reaches the surface of the epitaxial layer through the second insulating film, the second semiconductor layer and the offset insulating film pattern, a side wall insulating film formed on the side wall of the emitter opening, an emitter output electrode of first conduction type formed in the emitter opening so as to be connected to the epitaxial layer, and an emitter layer of first conduction type formed on an upper layer of the epitaxial layer to which the emitter electrode is connected.

In the second type bipolar transistor having the above configuration, the graft base layer is formed so that it may be positioned both on the epitaxial layer near the edge of the base opening and on the first semiconductor layer, so the graft base layer is formed at a portion near the edge of the base opening, where crystallinity of the epitaxial layer is deteriorated. Thus, it can be avoided to place a pn junction at the portion where crystallinity of the epitaxial layer is deteriorated and the pn junction can be placed in another area where good crystallinity is assured.

The third manufacturing method is for the above second type bipolar transistor and comprises five processes.

The first process comprises the steps of forming a first insulating film on a first semiconductor layer of first conduction type used as a collector, forming a base opening in the first insulating film formed on the first semiconductor layer, and forming an epitaxial layer of second conduction type inside the base opening.

The second process comprises the steps of forming an offset insulating film pattern on the epitaxial layer, away from the edge of the base opening by a specified distance, and forming a second semiconductor layer of second conduction type so that it is connected at least to the epitaxial layer on the side of the offset insulating film pattern.

The third process comprises the step of implanting impurities of second conduction type into at least the second semiconductor layer and the epitaxial layer of the second semiconductor layer, the epitaxial layer and the first semiconductor layer below the epitaxial layer by ion implantation using the offset insulating film pattern as a mask.

The fourth process comprises the steps of forming a second insulating film to cover the second semiconductor layer, forming an emitter opening reaching the surface of the epitaxial layer through the second insulating film, the second semiconductor layer and the offset insulating film pattern, and forming a side wall insulating film on the side wall of the emitter opening.

The fifth process comprises the steps of forming a conductive layer containing impurities of first conduction type in the emitter opening, and forming an emitter layer by diffusing the impurities of first conduction type into an upper layer of the epitaxial layer from the conductive layer by a diffusion processing as well as forming a graft base layer by diffusing impurities of second conduction type implanted into the epitaxial layer further into the first semiconductor layer below the epitaxial layer.

The step of forming a graft base layer in the above fifth process can be carried out by activating impurities of second conduction type implanted into the epitaxial layer and the first semiconductor layer below the epitaxial layer.

In the above third manufacturing method, second conduction type impurities are implanted into the second semiconductor layer and the epitaxial layer by ion implantation using the offset insulating film pattern as a mask, and furthermore the second conduction type impurities implanted into the epitaxial layer are diffused in the first semiconductor layer formed below the epitaxial layer to form a graft base layer, so that the graft base layer is positioned both on the epitaxial layer near the edge of the base opening and on the first semiconductor layer. In this case, the graft base layer comes close to the base opening, where crystallinity of the epitaxial layer is deteriorated, and the pn junction with the emitter layer is thus formed in an area of the epitaxial layer, where good crystallinity is assured.

The fourth manufacturing method is also for the above second type bipolar transistor and comprises four processes.

The first process comprises the steps of forming a first insulating film containing impurities of second conduction type on a first semiconductor layer of first conduction type used as a collector, forming a base opening in the first insulating film formed on the first semiconductor layer, forming an epitaxial layer of second conduction type inside the base opening, and forming a graft base layer by diffusing impurities of second conduction type into both the epitaxial layer and the first semiconductor layer near the edge of the base opening from the first insulating film by solid phase diffusion of the impurities.

The second process comprises the steps of forming an offset insulating film pattern on the epitaxial layer, away from the edge of the base opening by a specified distance, and forming a second semiconductor layer of second conduction type so that it is connected at least to the epitaxial layer on the side of the offset insulating film pattern.

The third process comprises the steps of forming a second insulating film to cover the second semiconductor layer, forming an emitter opening reaching the surface of the epitaxial layer through the second insulating film, the second semiconductor layer and the offset insulating film pattern, and forming a side wall insulating film on the side wall of the emitter opening.

The fourth process comprises the steps of forming a conductive layer containing impurities of first conduction type in the emitter opening, and forming an emitter layer by diffusing the impurities of first conduction type into an upper layer of the epitaxial layer from the conductive layer by a diffusion processing.

Otherwise, the graft base layer in the first process may also be formed by forming the first insulating film containing second conduction type impurities on the first semiconductor layer, then forming a base opening in the first insulating film on the first semiconductor layer, and forming a second conduction type epitaxial layer in this base opening. After this, a mask provided with an opening is formed near the edge of the base opening and the mask is used for ion implantation of second conduction type impurities into both the epitaxial layer near the edge of the base opening and the first semiconductor layer to form the graft base layer.

In the above fourth manufacturing method, second conduction type impurities are diffused from the first insulating film containing the second conduction type impurities into both the epitaxial layer and the first semiconductor layer near the edge of the base opening to form the graft base layer. Otherwise, second conduction type impurities may be implanted into both the epitaxial layer and the first semiconductor layer near the edge of the base opening by ion implantation using a mask provided with an opening formed near the edge of the base opening to form the graft base layer. Thus, the graft base layer is formed both in the epitaxial layer and on the first semiconductor layer near the edge of the base opening where crystallinity of the epitaxial layer is deteriorated. Hence, the pn junction with the emitter layer can be formed at a portion where good crystallinity is assured.

DETAILED DESCRIPTION OF THE PREFERRED EMBODIMENTS

Figure 1A:
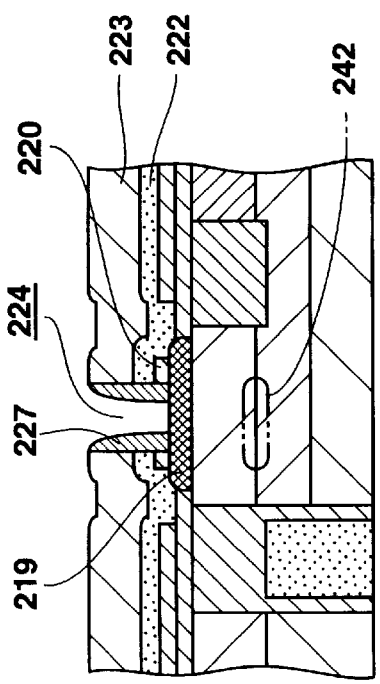
FIG. 1A through FIG. 1D illustrate manufacturing processes of a bipolar transistor in a related art.
Figure 1C:
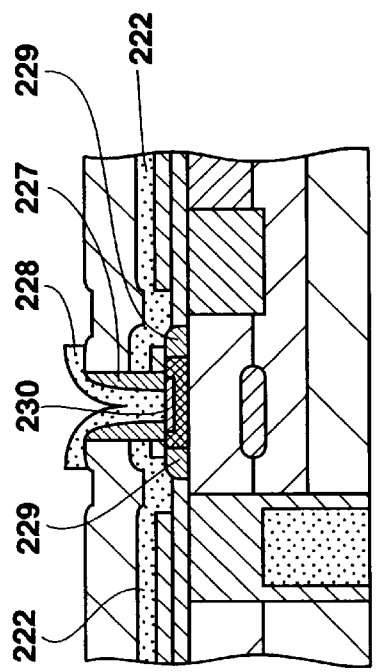
Figure 1B:
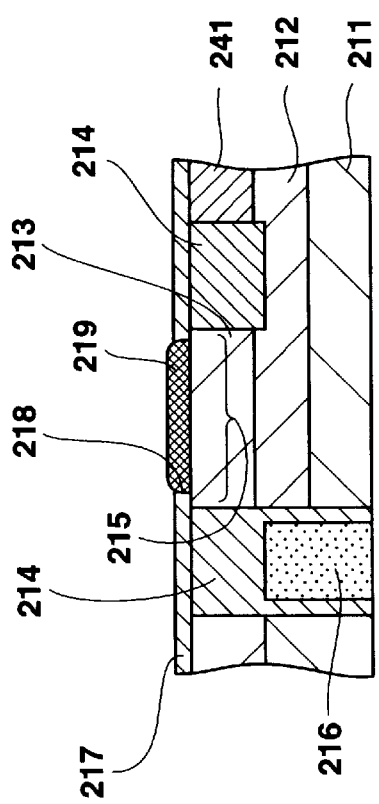
Figure 1D:
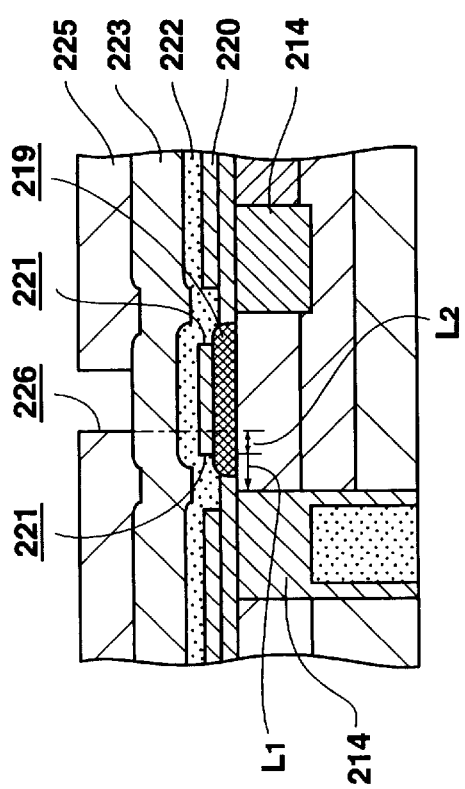
Figure 2:
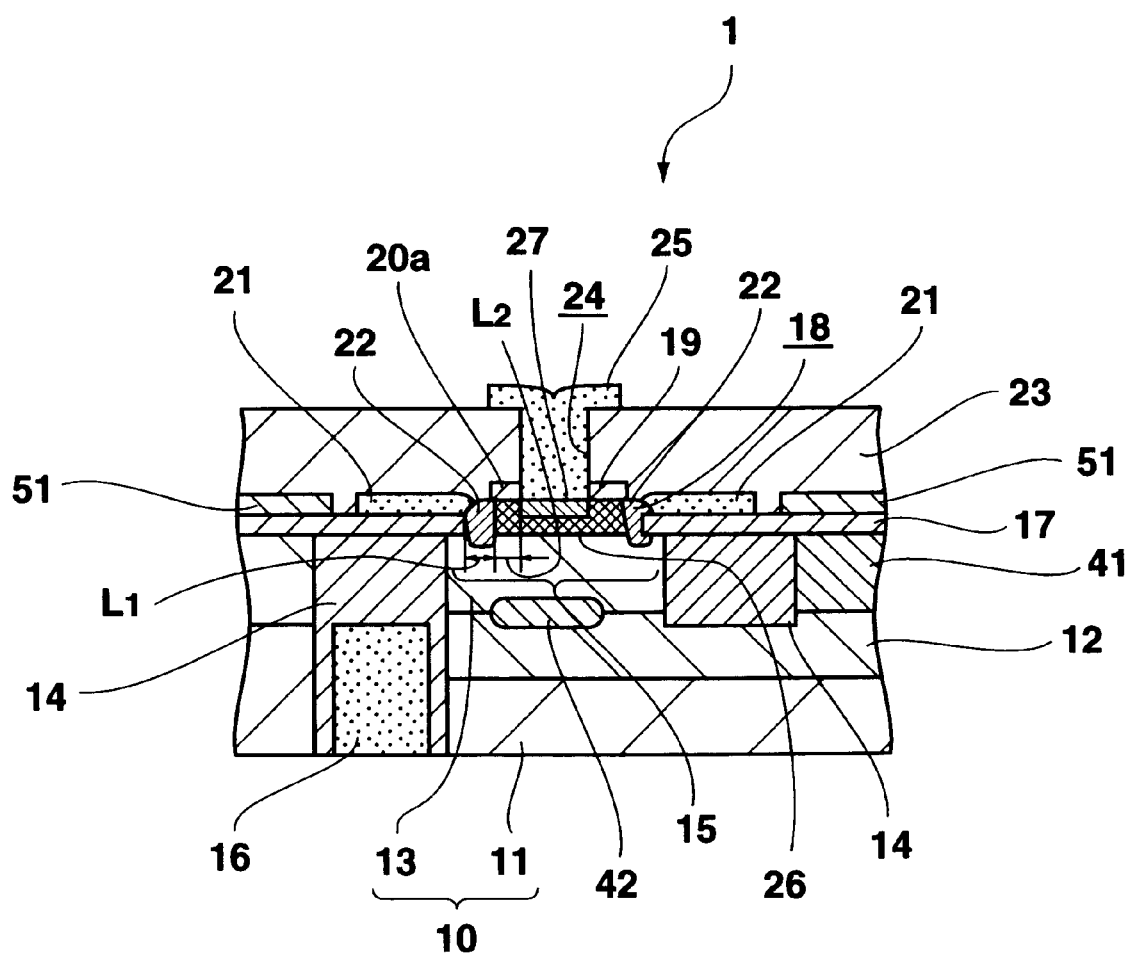
FIG. 2 is a cross sectional view schematically showing the configuration of an embodiment of a bipolar transistor according to this invention.

Hereunder, an embodiment of this invention will be described with reference to FIG. 2 showing a cross section view of the bipolar transistor configuration of this invention. In the following explanation, the first conduction type will be defined as n type and the second conduction type as p type.

As shown in FIG. 2, an embedded layer of the first conduction type (hereafter, to be referred to as n+, "+" means higher impurity density) is formed on a silicon substrate 11 of the second conduction type (hereafter, to be referred to as p type). And on the p type silicon substrate 11 is formed an n type epitaxial layer 13 as a first conduction type first semiconductor layer. This n type epitaxial layer 13 functions as a collector layer. At the bottom of the n type epitaxial layer 13 is diffused a little the n+ type embedded layer 12. A semiconductor substrate 10 is formed such way with the p type silicon substrate 11 and the n type epitaxial layer 13.

A trench structured element separating area 14 is formed in the n type epitaxial layer 13. This element separating area 14 separates an element forming area 15 from others. In this deep element separating area 14, a polysilicon layer 16 is embedded as shown.

Furthermore, this bipolar transistor is also provided with an n+ type collector output diffusion layer 41 connected to the n+ type embedded layer 12.

First insulating film 17 made of, for example, an oxidized silicon film, is formed on the n type epitaxial layer 13. This first insulating film 17 may also be formed with a laminated film of an oxidized silicon film formed by, for example, thermal oxidation and an oxidized silicon film formed by the CVD method, or a laminated film of an oxidized silicon film formed by, for example, thermal oxidation and a polysilicon film formed by the CVD method, or the like.

A base opening 18 is formed in the first insulating film 17 formed in the element forming area 15.

A second conductive (p type) epitaxial layer 19 is formed to be positioned both inside the base opening 18 and on the first insulating film 17. This p type epitaxial layer 19 is made of silicon (Si), germanium (Ge), silicon germanium ($Si_{1-x}Ge_x$), or the like in which, for example, P type impurities such as boron (B) are implanted. Thus, a single crystal layer is formed on the n type epitaxial layer 13 and a poly-crystal layer is formed on the first insulating film 17. This poly-crystal layer functions as a base output electrode 21. A low resistance thin base layer is formed such way by forming a p type epitaxial layer 19, so this invention can realize a high performance bipolar transistor.

Furthermore, if germanium, silicon germanium, or the like is used for this epitaxial layer 19, a narrow band gap base can be materialized, enabling emitter implantation efficiency to be more improved, as well as base resistance to be reduced significantly.

On the single crystal layer of the p type epitaxial layer 19 is formed an offset insulating film pattern 20a, away from the edge of the base opening 18 by a width of $L_1$.

Furthermore, a dummy pattern 51 comprising the same layer as that of the offset insulating film pattern 20a is formed on the first insulating film 17 on the side of the base output electrode 21 comprising a poly-crystal layer.

A p+ type graft base layer 22 is formed to be positioned both on the n type epitaxial layer 13 and on the p type epitaxial layer 19 near the edge of the base opening 18.

Second insulating film 23 is formed with an oxidized silicon film, covering the epitaxial layer 19.

An emitter opening 24 is formed so that it may reach the surface of the p type epitaxial layer 19 through both the second insulating film 23 and the offset insulating film pattern 20a.

This emitter opening 24 is positioned in the upper portion inside the offset insulating film pattern 20a formed on the element forming area 15. For example, the opening 24 is away from one end of the offset insulating film pattern 20a by a width of $L_2$. Thus, part of the offset insulating film pattern 20a is left as is by a width of $L_2$.

A polysilicon layer 25 used as an n+ type emitter output electrode is formed with a polysilicon layer inside the emitter opening 24.

The single crystal layer of the p type epitaxial layer 19 becomes a p type base layer 26. An n+ type emitter layer 27 connected to the polysilicon layer 25 is formed on the p type base layer 26 separated from the p+ type graft base layer 22.

Furthermore, a n+ type deep impurity area 42 is formed near the boundary between the n+ type embedded layer 12 and the n type epitaxial layer 13 under the p type epitaxial layer 19.

Since a p+ type graft base layer 22 is formed to be positioned both on the p type epitaxial layer 19 near the edge of the base opening 18 and on the n type epitaxial layer 13, a p+ type graft base layer 22 comes close to the edge of the base opening 18, where crystallinity of the n type epitaxial layer 13 is to be deteriorated. In other words, the junction between the n type epitaxial layer 13 and the p+ type graft base layer 22 is separated from the base opening 18. Consequently, it is avoided to form a pn junction at a portion where crystallinity of the n type epitaxial layer 13 is to be deteriorated. Instead, the pn junction can be positioned in an area where good crystallinity is assured for the n type epitaxial layer 13, preventing junction leaks to be caused by crystallinity deterioration.

Furthermore, in a structure in which a dummy pattern 51 is formed, the surface of the second insulating film 23 is flattened. Thus, multiple-layer wiring (not shown here) can be formed easily on the second insulating film 23.

Subsequently, an embodiment of this invention for the first manufacturing method of the above bipolar transistor will be described with reference to the manufacturing processes shown in FIG. 3A through FIG. 3C.

Figure 3A:
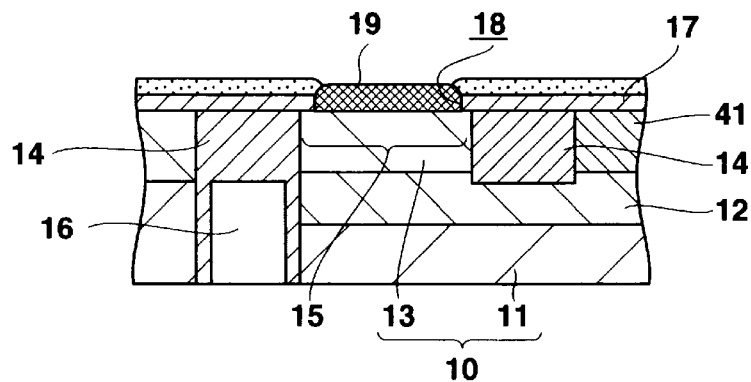
FIG. 3A through FIG. 3C illustrate manufacturing processes relating to the first manufacturing method of this invention.
Figure 3B:
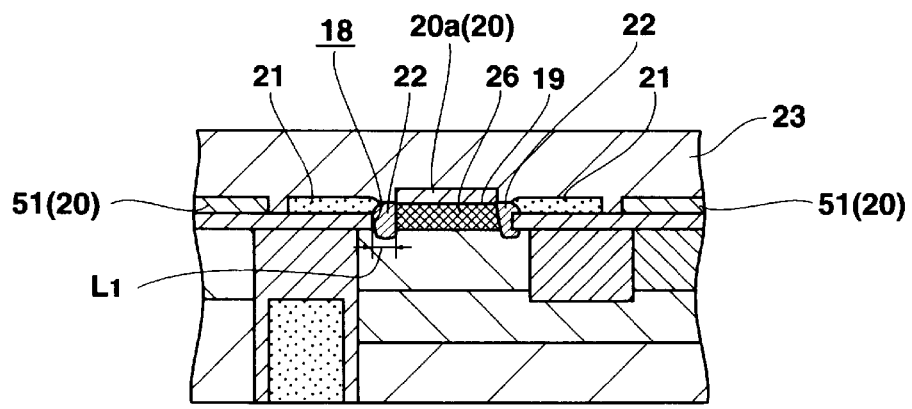
Figure 3C:
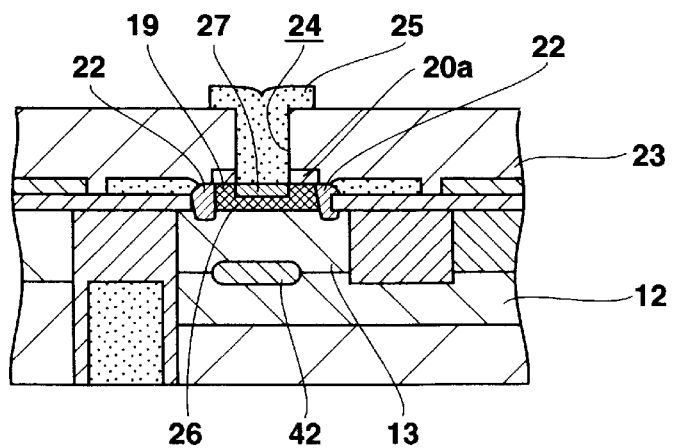

In FIG. 3A through FIG. 3C, the first conduction type is assumed to be n type and the second conduction type to be p type for explaining an npn bipolar transistor. In FIG. 3A through FIG. 3C, the same codes will be given to the same items as those in FIG. 2, avoiding redundant explanation.

As shown in FIG. 3A, in the first process, an embedded layer 12 of the first conduction type (hereafter, to be referred to as n+ type, "+" means higher impurity density) is formed on a silicon substrate 11 of the second conduction type (hereafter, to be referred to as p type) by, for example, solid phase diffusion. Then, an n type epitaxial layer 13 is formed over the p type silicon substrate 11 by epitaxial growth. At this time, the n+ type embedded layer 12 is a little diffused to the bottom of the n type epitaxial layer 13. A semiconductor substrate 10 is formed such way with the p type silicon substrate 11 and the n type epitaxial layer 13.

After this, for example, a trench structured element separating area 14 is formed on the n type epitaxial layer 13 by selective non-isotropic etching and insulating film embedding technologies. This element separating area 14 separates an element forming area 15 from others.

The deep element separating area 14 may also be provided with a polysilicon layer 16 embedded in it.

Furthermore, an n+ type collector output diffusion layer 41 is formed by selective ion implantation and it is connected to the n+ type embedded layer 12.

Subsequently, first insulating film 17 is formed with, for example, an oxidized silicon film all over the epitaxial layer 13 with the CVD method. Instead of this first insulating film 17, a laminated layer of an oxidized silicon film formed by thermal oxidation and an oxidized silicon film formed by the CVD method or a laminated layer of an oxidized silicon film formed by thermal oxidation and a polysilicon film formed by the CVD method may be formed.

Subsequently, a resist pattern (not illustrated) is formed in the element forming area 15 by lithographic technology. The resist pattern is provided with an opening. The resist pattern is used as an etching mask for forming a base opening 18 in the first insulating film 17 formed in the element forming area 15.

After this, the resist pattern is removed. The resist pattern used as an etching mask is removed after etching is ended. The resist pattern used as an ion implantation mask is removed after ion implantation is ended.

Subsequently, a P type epitaxial layer 19 is formed so that it may be positioned both inside the base opening 18 and on the first insulating film 17. This p type epitaxial layer 19 is made of silicon (Si), germanium (Ge), silicon germanium ($Si_{1-x}Ge_x$), or the like in which, for example, P type impurities such as boron (B) are implanted. By using such an epitaxial growth method, a thin base layer can be formed at a low resistance and good controllability, providing a high performance bipolar transistor.

Furthermore, if germanium, silicon germanium, or the like is used for this epitaxial layer 19, a narrow band gap base can be materialized, enabling emitter implantation efficiency to be more improved, as well as base resistance to be reduced significantly.

The p type epitaxial layer 19 becomes a single crystal layer on the n type epitaxial layer 13 and a poly-crystal layer on the first insulating film 17. This poly-crystal layer becomes part of a base output electrode to be formed later.

After this, the second process is started as shown in FIG. 3B. In this process, a resist pattern (not illustrated) is formed, covering a base forming area and a base output electrode forming area by lithographic technology. The resist pattern is then used as an etching mask for patterning the p type epitaxial layer 19.

Subsequently, an insulating film 20 is formed with an oxidized silicon film all over the patterned epitaxial layer 19 by the CVD method. This insulating film 20 may also be formed with a laminated layer of a thin oxidized silicon film formed by thermal oxidation and an oxidized silicon film formed by the CVD method instead of the oxidized silicon film described above.

Then, a resist pattern (not illustrated) is formed so that it may cover the p type epitaxial layer 19 used as a base layer and expose the same layer 19 at least in a portion near the edge of the base opening 18. The resist pattern is used as an etching mask for patterning the insulating film 20. After this, an offset insulating film pattern 20a comprising an insulating film 20 is formed on the p type epitaxial layer 19.

One side of this offset insulating film pattern 20a is away from one edge of the base opening 18 by a width of $L_1$ toward the p type epitaxial layer 19. This width $L_1$ is decided by the accuracy of lithography mask alignment. For example, it becomes about 0.2 $\mu$m in width.

Consequently, the surface of the p type epitaxial layer 19 formed inside the base opening is exposed by a width of $L_1$ on the side of the offset insulating film pattern 20a.

Dummy patterns 51 are also formed on the first insulating film 17 on the side of each base output electrode 21 with an insulating film 20 respectively in the above patterning. When dummy patterns 51 are formed such way, the surface of an insulating film to be formed after this is flattened, enabling high integrating and high reliability wiring layers to be formed.

After this, p type impurities are implanted in the exposed portion of the p type epitaxial layer 19 and in the n type epitaxial layer 13 just below the exposed epitaxial layer 19 using the offset insulating film pattern 20a as a mask. Thus, a p+ type graft base layer 22 is formed. At the same time, ion implantation is also carried out for the p type epitaxial layer 19 formed on the first insulating film 17 to form p+ type base output electrodes 21.

Ion implantation may be carried out as needed while the resist pattern used for forming the offset insulating film pattern 20a is left as is.

Since the offset insulating film pattern 20a is used as a mask, no p type impurity is implanted in the p type epitaxial layer 19 covering the offset insulating film pattern 20a. Thus, distribution of impurities is kept as desired in the covered portion of the p type epitaxial layer 19 as it is formed by the epitaxial growth. That portion becomes a p type base layer 26.

Subsequently, the third process is started. In this process, second insulating film 23 is formed with an oxidized silicon film all over the surface of the object using the CVD method.

After this, as shown in FIG. 3C, a resist pattern (not illustrated) is formed by lithographic technology so that the pattern may be provided with an opening in the upper portion inside the offset insulating film pattern 20a. The resist pattern is used as an etching mask to form an emitter opening 24 both in the second insulating film 23 and in the offset insulating film pattern 20a. Consequently, this emitter opening pattern 24 is positioned inside the p+ type graft base layer 22 formed on the p type epitaxial layer 19.

In the above etching, both the offset insulating film pattern 20a and the p type epitaxial layer 19 on the ground can select etching properties, so a shallow base layer can be formed in the stable state on the p type epitaxial layer 19.

After this, ion implantation is carried out to form an n+ type deep impurity area 42 near the boundary between the n+ type embedded layer 12 under the p type epitaxial layer 19 and the n type epitaxial layer 13.

Subsequently, the fourth process is started. In this process, a polysilicon layer 25 is formed, for example, with the CVD method inside the emitter opening 24. Then, n type impurities are implanted by ion implantation in the polysilicon layer 25. Thus, the polysilicon layer 25 becomes a first conduction type (n type) conductive layer.

After this, a thermal treatment is carried out to diffuse impurities from the polysilicon layer 25 to form an n+ type emitter layer 27 on the p type base layer 26.

The above thermal treatment is carried out, for example, as an [RTA (Rapid Thermal Annealing)] within a heating temperature range of 900 to 1100° C. for a few seconds to a few tens of seconds.

The above thermal treatment may also be annealing by light exposure such as lamp annealing, excimer laser annealing.

The subsequent processes will be explained without using any drawing.

At first, contact holes used as collector and base outputs are formed. Then, base electrodes, emitter electrodes, and collector electrodes are formed to finish the manufacturing of the bipolar transistor of this invention.

In the above first manufacturing method, a deep p+ type graft base layer 22 is formed by ion implantation so that the layer 22 may reach the surface of the n type epitaxial layer 13 through the p type epitaxial layer 19. The offset insulating film pattern 20a is used as an etching mask in this process. Thus, the junction between the p type graft base layer 22 and the n type epitaxial layer 13 used as a collector area can be separated from the edge of the base opening 18. Consequently, no pn junction is formed at the portion where crystallinity of the p epitaxial layer 19 near the edge of the base opening 18 is deteriorated. This is because a p+ graft base layer 22 is formed there. As a result, no junction leak occurs where crystallinity of the p type epitaxial layer 19 is deteriorated.

Furthermore, since the offset insulating film pattern 20a is used as a mask, ion implantation does not affect impurity implantation into the p type epitaxial layer 19 used as a p type base layer 26 at all.

Since the emitter opening 24 is positioned both in the second insulating film 23 and in the offset insulating film pattern 20a, the p type epitaxial layer 19 can select etching properties. Thus, the p type epitaxial layer 19 is never be over-etched and the p type epitaxial layer 19 can keep a film thickness controlled properly by epitaxial growth, enabling a shallow junction base layer 26 to be formed.

Thus, a high performance bipolar transistor can be materialized.

Subsequently, another embodiment of this invention associated with the second manufacturing method will be described with reference to the manufacturing processes shown in FIG. 4A through FIG. 4C.

Figure 4A:
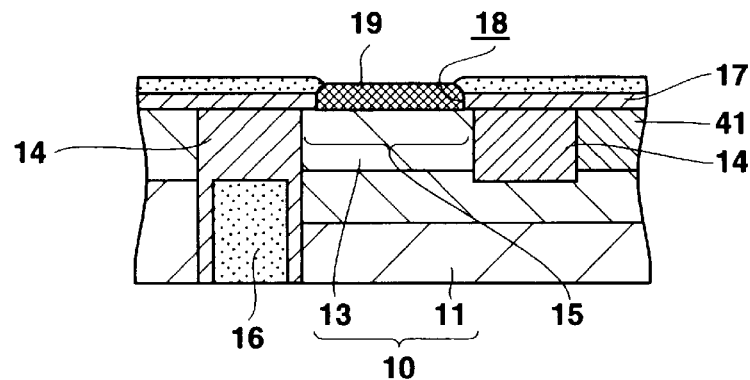
FIG. 4A through FIG. 4C are manufacturing processes relating to the second manufacturing method of this invention.
Figure 4B:
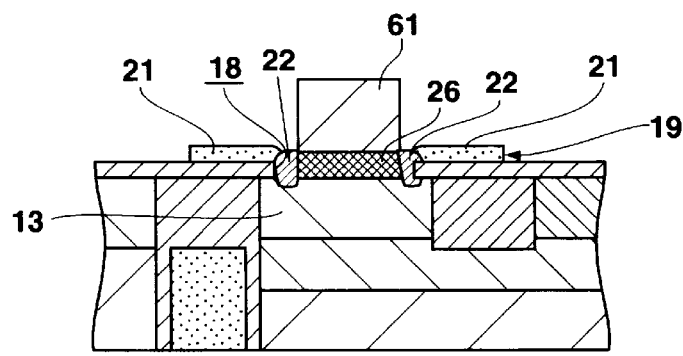
Figure 4C:
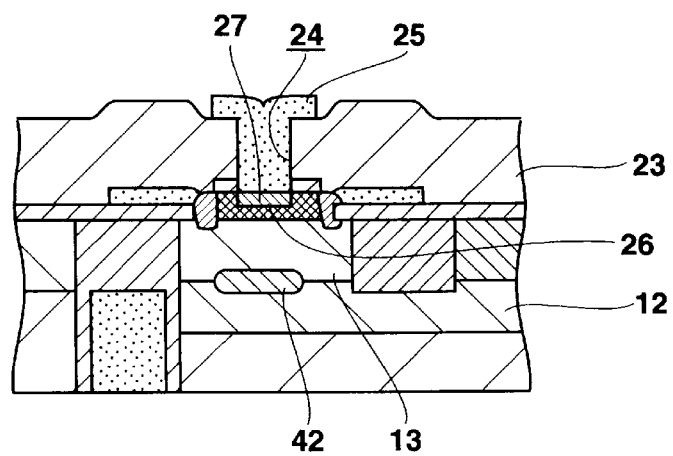

In FIG. 4A through FIG. 4C, the first conduction type is defined as n type and the second conduction type as p type for explaining an npn bipolar transistor. In FIG. 4A through FIG. 4C, the same codes are given to the same items as those in FIG. 3A through FIG. 3C, avoiding redundant explanation.

As shown in FIG. 4A, in the first process, an n+ type embedded layer 12 is formed on a p type silicon substrate 11 just as explained in FIG. 3A. Then, an n type epitaxial layer 13 is formed over the p type silicon substrate 11. A p type semiconductor substrate 10 is formed such way with the p type silicon substrate 11 and the n type epitaxial layer 13.

After this, an element separating area 14 is formed on the n type epitaxial layer 13. This element separating area 14 separates an element forming area 15 from others.

The deep element separating area 14 is provided with a polysilicon layer 16 embedded in it as shown.

Furthermore, an n+ type collector output diffusion layer 41 is formed and connected to the n+ type embedded layer 12.

Subsequently, first insulating film 17 is formed with, for example, an oxidized silicon film all over the epitaxial layer 13. Then, a base opening 18 is formed in the first insulating film 17 formed in the element forming area 15.

Subsequently, a P type epitaxial layer 19 is formed so that it may be positioned both inside the base opening 18 and on the first insulating film 17. This p type epitaxial layer 19 is made of silicon (Si), germanium (Ge), silicon germanium ($Si_{1-x}Ge_x$), or the like in which, for example, P type impurities such as boron (B) are implanted. By using such an epitaxial growth method, a thin base layer can be formed at a low resistance and good controllability, providing a high performance bipolar transistor.

Furthermore, if germanium, silicon germanium, or the like is used for this epitaxial layer 19, a narrow band gap base can be materialized, enabling emitter implantation efficiency to be more improved, as well as base resistance to be reduced significantly.

The p type epitaxial layer 19 becomes a single crystal layer on the n type epitaxial layer 13 and a poly-crystal layer on the first insulating film 17. This poly-crystal layer becomes part of a base output electrode to be formed later.

After this, the second process is started just as described with reference to FIG. 3B. In this process, a p type epitaxial layer 19 is patterned to form patterns used as a base layer and a base output electrode.

Subsequently, a resist pattern 61 is formed, covering an area used as a base layer 26 by lithographic technology. This resist pattern is used as a mask for ion implantation of p type impurities into the p type epitaxial layer 19 near the edge of the base opening and into a layer on the n type epitaxial layer 13 to form a p+ type graft base layer 22. At this time, ion implantation is also carried out for the p type epitaxial layer 19 on the first insulating film 17 to form p+ type base output electrodes 21.

The p type epitaxial layer 19 covered by the resist pattern 61 becomes a p type base layer 26. No impurities are implanted in this p type base layer 26. Thus, the p type base layer keeps the desired distribution of impurities as is formed by epitaxial growth.

Patterning of the p type epitaxial layer 19 may also be made after ion implantation for forming the p+ type graft base layer 22.

After this, the resist pattern used as the above ion implantation mask is removed.

Subsequently, the third process is started as shown in FIG. 4C. In this process, the second insulating film 23 is formed with an oxidized silicon film all over the surface of the object using the CVD method.

After this, as explained in FIG. 2C, an emitter opening 24 is formed in the second insulating film 23 so that it may be positioned inside the p+ type graft base layer 22 formed in the p type epitaxial layer 19.

After this, an n+ type deep impurity area 42 is formed near the boundary between the n+ type embedded layer 12 under the p type base layer 26 and the n type epitaxial layer 13.

Subsequently, the fourth process is started. In this process, a polysilicon layer 25 is formed inside the emitter opening 24. Then, n type impurities are implanted by ion implantation in the polysilicon layer 25. Thus, the polysilicon layer 25 becomes a first conduction type (n type) conductive layer. And, an n+ type emitter layer 27 is formed by diffusion of impurities from this polysilicon layer 25 on the p type base layer 26.

The subsequent processes will be explained without using any drawing.

At first, contact holes used as collector and base outputs are formed. Then, base electrodes, emitter electrodes, and collector electrodes are formed to finish the manufacturing of the bipolar transistor of this invention.

In the above second manufacturing method, a deep p+ type graft base layer 22 is formed by ion implantation so that the layer 22 may reach the surface of the n type epitaxial layer 13 from the p type epitaxial layer 19. Thus, the junction between the p type graft base layer 22 and the n type epitaxial layer 13 used as a collector area can be separated from the edge of the base opening 18. Consequently, no pn junction is formed at the portion where crystallinity of the p epitaxial layer 19 near the edge of the base opening 18 is deteriorated. This is because a p+ graft base layer 22 is formed there. As a result, no junction leak occurs where crystallinity of the p type epitaxial layer 19 is deteriorated.

Furthermore, since the resist pattern is used as a mask, ion implantation does not affect impurity implantation into the p type epitaxial layer 19 used as a p type base layer 26 at all.

Furthermore, since the emitter opening 24 is formed in the second insulating film 23, the p type epitaxial layer 19 can select etching properties, so that the p type epitaxial layer 19 is never be over-etched. Thus, the p type epitaxial layer 19 can keep a film thickness controlled properly by epitaxial growth, enabling a shallow junction base layer 26 to be formed.

Thus, a high performance bipolar transistor can be materialized.

Furthermore, in the above manufacturing method, since the polysilicon layer 25 is formed with doping polysilicon using the CVD method, diffusion can be made at low temperature. And, since the p+ type graft base layer 22 is formed by ion implantation before the polysilicon layer 25 is formed, a deep p+ type graft base layer 22 can be formed even under a low temperature diffusion condition.

Figure 5:
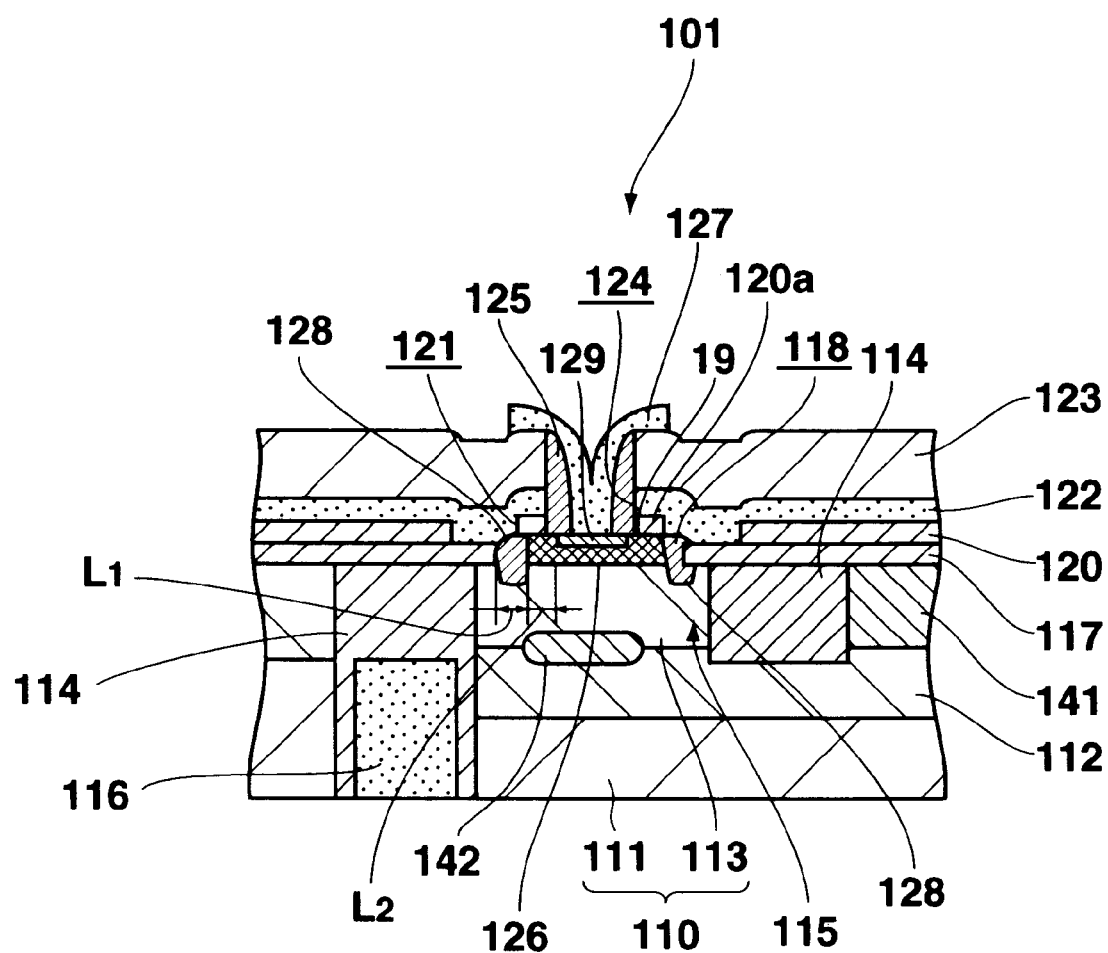
FIG. 5 is a cross sectional view schematically showing the configuration of another embodiment of a bipolar transistor according to this invention.

Hereunder, another embodiment of this invention will be described with reference to FIG. 5 showing a cross section view of the bipolar transistor of this invention. In the following explanation, the first conduction type will be defined as n type and the second conduction type as p type.

As shown in FIG. 5, an embedded layer of the first conduction type (hereafter, to be referred to as n+, "+" means higher impurity density) is formed on a silicon substrate 111 of the second conduction type (hereafter, to be referred to as p type). And, on the p type silicon substrate 111 is formed an n type epitaxial layer 113 as a first conduction type first semiconductor layer. This n type epitaxial layer 113 functions as a collector layer. At the bottom the n type epitaxial layer 113 is diffused a little the n+ type embedded layer 112. A semiconductor substrate 110 is formed such way with the p type silicon substrate. 111 and the n type epitaxial layer 113.

A trench structured element separating area 114 is formed on the n type epitaxial layer 113. This element separating area 114 separates an element forming area 115 from others. In this deep element separating area 114, a polysilicon layer 116 is embedded as shown.

Furthermore, this bipolar transistor is also provided with an n+ type collector output diffusion layer 141 connected to the n+ type embedded layer 112.

First insulating film 117 made of, for example, an oxidized silicon film, is formed on the n type epitaxial layer 113. This first insulating film 117 may also be formed with a laminated film of an oxidized silicon film formed by, for example, thermal oxidation and an oxidized silicon film formed by the CVD method, or a laminated film of an oxidized silicon film formed by, for example, thermal oxidation and a polysilicon film formed by the CVD method.

A base opening 118 is formed in the first insulating film formed on the surface of the element forming area 115.

Second conductive (p type) epitaxial layer 119 is formed in the base opening 118. This p type epitaxial layer 119 is made of silicon (Si), germanium (Ge), silicon germanium ($Si_{1-x}Ge_x$), or the like in which, for example, P type impurities such as boron (B) are implanted. By forming the p type epitaxial layer 119 such way, a low resistance thin base layer can be formed to improve the performance of the target bipolar transistor significantly.

Furthermore, if germanium, silicon germanium, or the like is used for this epitaxial layer 19, a narrow band gap base can be materialized, enabling emitter implantation efficiency to be more improved, as well as base resistance to be reduced significantly.

Furthermore, an insulating film 120 is formed with an oxidized silicon film, covering the p type epitaxial layer 119 entirely.

An opening for connection 121 is formed in the insulating film 120. This opening 121 is overlapped partially with an element separating area 114 and extended by a width of $L_1$ toward the element forming area 115 from the base opening 118.

Thus, an offset insulating film pattern 120a of the insulating film 120 is formed on the surface of the element forming area 115 and the surface of a p type epitaxial layer 119 is exposed by a width of $L_1$ at the bottom of the opening 121.

A p type polysilicon layer 122 is formed as a second conduction type second semiconductor layer, covering the insulating film 120. This p type polysilicon layer 122 is connected to the p type epitaxial layer 119 inside the opening 121.

Furthermore, second insulating film 123 is formed with, for example, an oxidized silicon film, covering the p type polysilicon layer 122.

An emitter opening 124 is formed so that it may reach the surface of the p type epitaxial layer 119 through the second insulating film 123, the p type polysilicon layer 122, and the offset insulating film pattern 120a.

This emitter opening 124 is formed in the upper portion inside the offset insulating film pattern 120a formed on the surface of the element forming area 115. For example, the opening 124 is away from the end of the offset insulating film pattern 120a by a width of $L_2$. Thus, part of the offset insulating film pattern 120a is left as is by a width of $L_2$.

Furthermore, an n+ type deep impurity area 142 is formed near the boundary between the n+ type embedded layer 112 and the n type epitaxial layer 113 under the p type epitaxial layer 119 used as a p type base layer 126.

A side wall insulating film 125 is formed on the side wall of the emitter opening 124, and an n+ type polysilicon layer 127 used as an emitter output electrode is formed inside the emitter opening 124.

Furthermore, a p+ type graft base layer 128 is formed by diffusion of impurities from the p type polysilicon layer 122 in an area between the p type epitaxial layer 119 and the n type epitaxial layer 113, facing down to an area where this polysilicon layer 122 is connected to the p type epitaxial layer 119.

Then, an n+ type emitter layer 129 is formed on the p type epitaxial layer, away from the p+ type graft base layer 128 and connected to the n+ type polysilicon layer 127.

In the bipolar transistor 101 in the above configuration, since a p+ type graft base layer 128 is formed in an area between the p type epitaxial layer 119 and the n type epitaxial layer 113, facing down to an area where this polysilicon layer 122 is connected to the p type epitaxial layer 119, the junction between the p+ type graft base layer 128 and the n type epitaxial layer 118 used as a collector area is separated from the edge of the base opening 118. And, no pn junction is positioned in the area where crystallinity of the p type epitaxial layer 119 at the edge of the base opening 118 is deteriorated, that is, near the edge of the base opening 118. Consequently, junction leaks caused by deterioration of the crystallinity can be prevented there, since no pn junction is provided in this area.

Furthermore, since an offset insulating film pattern 120a is provided on a p type epitaxial layer 119 at a width of $L_2$, an enough distance can be secured between the n+ type emitter layer 129 and the p+ type graft base layer 128. Thus, an enough withstand voltage can be secured between the polysilicon layer 122 used as a base output electrode and the n+ type emitter layer 129.

Subsequently, another embodiment of this invention will be described with reference to FIG. 6A through FIG. 6D, explaining the third manufacturing method.

In FIG. 6A through FIG. 6D, the manufacturing method of a vertical npn bipolar transistor will be described.

Figure 6A:
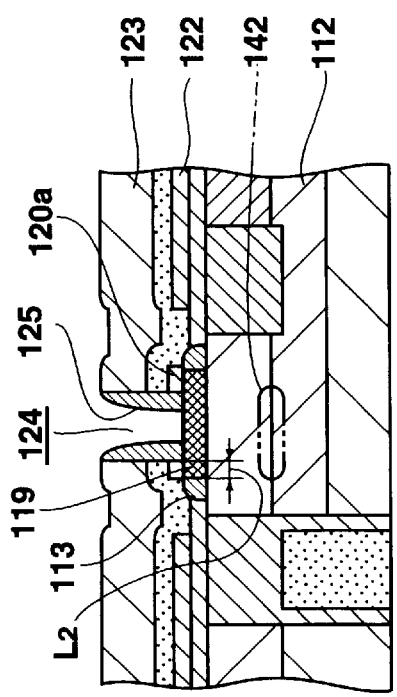
FIG. 6A through FIG. 6D illustrate manufacturing processes relating to the third manufacturing method of this invention.

As shown in FIG. 6A, in the first process, an embedded layer 112 of the first conduction type (hereafter, to be referred to as n+ type, "+" means higher impurity density) is formed on a silicon substrate 111 of the second conduction type (hereafter, to be referred to as p type) by, for example, solid phase diffusion. Then, an n type epitaxial layer 113 is formed over the p type silicon substrate 111 by epitaxial growth. At this time, the n+ type embedded layer 112 is a little diffused to the bottom of the n type epitaxial layer 113. A semiconductor substrate 110 is formed such way with the p type silicon substrate 111 and the n type epitaxial layer 113.

After this, for example, a trench structured element separating area 114 is formed on the n type epitaxial layer 113 by selective non-isotropic etching and insulating film embedding technologies. This element separating area 114 separates an element forming area 115 from others.

The deep element separating area 114 may also be formed to embed a polysilicon layer 116 in it.

Furthermore, an n+ type collector output diffusion layer 141 is formed by selective ion implantation and it is connected to the n+ type embedded layer 112.

Subsequently, first insulating film 117 is formed with, for example, an oxidized silicon film all over the epitaxial layer 113 with the CVD method. Instead of this first insulating film 117, a laminated layer of an oxidized silicon film formed by thermal oxidation and an oxidized silicon film formed by the CVD method, or a laminated layer of an oxidized silicon film formed by thermal oxidation and a polysilicon film formed by the CVD method may be formed.

Subsequently, a resist pattern (not illustrated) is formed in the element forming area 115 by lithographic technology. The resist pattern is provided with an opening. Then, the resist pattern is used as an etching mask for forming a base opening 118 in the first insulating film 117 formed on the surface of the element forming area 115.

After this, the resist pattern is removed. The resist pattern used as an etching mask is removed after etching is ended.

Subsequently, a P type epitaxial layer 119 is formed to be positioned both inside the base opening 18 and on the first insulating film 117. This p type epitaxial layer 119 is made of silicon (Si), germanium (Ge), silicon germanium ($Si_{1-x}Ge_x$), or the like in which, for example, P type impurities such as boron (B) are implanted. By using such an epitaxial growth method, a thin base layer can be formed at a low resistance and good controllability, providing a high performance bipolar transistor.

Furthermore, if germanium, silicon germanium, or the like is used for this epitaxial layer 119, a narrow band gap base can be materialized, enabling emitter implantation efficiency to be more improved, as well as base resistance to be reduced significantly.

If the first insulating film 117 is formed with an oxidized silicon film, no epitaxial growth is made on the oxidized silicon film and the silicon film is grown selectively only on the n type epitaxial layer 113. Thus, the surfaces of both the first insulating film 117 and the p type epitaxial layer 119 are aligned almost in the same height, that is, flattened.

Figure 6B:
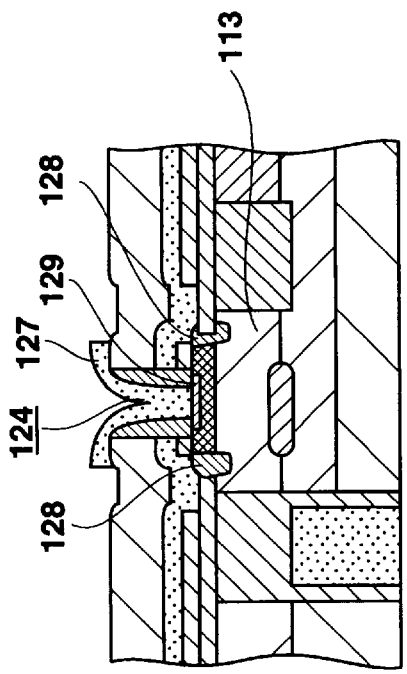

After this, the second process is started as shown in FIG. 6B. In this process, an insulating film 120 is formed all over the object with an oxidized silicon film using the CVD method. This insulating film 120 may also be formed by laminating a thin oxidized silicon film formed by thermal oxidation and an oxidized silicon film formed by the CVD method instead of the above oxidized silicon film.

After this, a resist pattern (not illustrated) used as an etching mask is formed by lithographic technology. The resist pattern is then used for etching the insulating film 120 to form an opening 121 connected to the p type epitaxial layer 119. At this time, an offset insulating film pattern 120a comprising the insulating film 120 is also formed on the p type epitaxial layer 119.

The opening 121 for connection is extended by a width of $L_1$ toward the p type epitaxial layer 119 from the edge of the base opening 118. This width $L_1$ is determined by the accuracy of lithography mask alignment. The value will be about 0.2 μm.

Consequently, the surface of the p type epitaxial layer 119 is exposed by a width of $L_1$ on the side of the offset insulating film pattern 120a, that is, at the bottom of the opening 121 for connection.

After this, the resist pattern is removed. Hereafter, each resist pattern used as an etching mask or ion implantation mask is expected to be removed after the corresponding process is ended.

Subsequently, a polysilicon layer 122 is formed all over the object using, for example, the CVD method. This polysilicon layer 122 functions as a base output electrode and covers the insulating film 120 through which the opening 121 is formed. At the bottom of the opening 121, the polysilicon layer 122 is connected to the surface of the p type epitaxial layer 119. Thus, the distance $L_1$ between the opening 121 for connection and the base opening 118 decides the area for connection between the polysilicon layer 122 and the p type epitaxial layer 119 used as a base area.

After this, the third process is started. In this process, p type impurities are implanted into the polysilicon layer 122 by ion implantation. At this time, p type impurities are also implanted deeply into the p type epitaxial layer 119 in the area specified by the distance $L_1$ under the optimized condition of ion implantation.

In the above ion implantation, the insulating film 120 is used as a mask, so no p type impurities are implanted into the p type epitaxial layer 119 covered by the offset insulating film pattern 120a. Distribution of impurities in the p type epitaxial layer 119 formed by epitaxial growth is thus kept as is.

After this, a resist mask used as an etching mask is formed by lithographic technology and the p type polysilicon layer 122 described above is patterned by dry etching technology using the formed etching mask.

Subsequently, the fourth process is started. In this process, second insulating film 123 is formed all over the object with an oxidized silicon film using the CVD method.

After this, a resist film 161 is formed by lithographic technology and an opening 162 is formed in the resist film 161. The opening pattern 161 should be positioned in the upper portion inside the offset insulating film pattern 120a formed on the p type epitaxial layer 119. For example, it comes inside by a width of $L_2$ from the end of the offset insulating film pattern 120a.

Figure 6C:
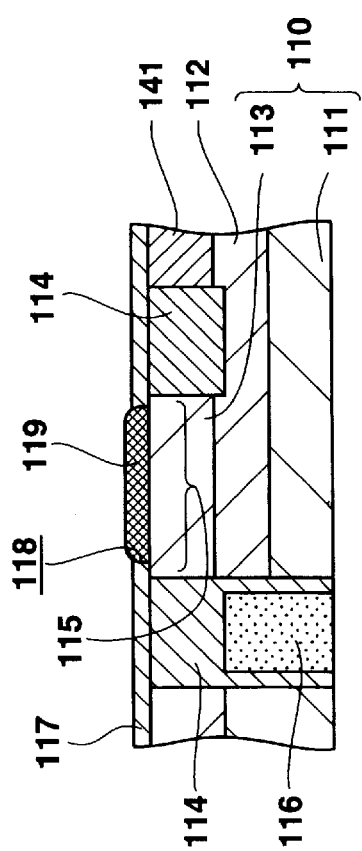

Subsequently, as shown in FIG. 6C, an emitter opening 124 is formed so that it may reach the surface of the p type epitaxial layer 119 through the second insulating film 123, the polysilicon layer 122, and the offset insulating film pattern 120a by non-isotropic etching using the resist film 161 as a mask. This emitter opening 124 is formed by copying the shape of the opening 162.

Consequently, the emitter opening 124 is positioned in the upper portion inside the offset insulating film pattern 120a on the surface of the element forming area 115. For example, the opening 124 is away from one end of the offset insulating film pattern 120a by a width of $L_2$. Thus, part (a width of $L_2$) of the offset insulating film pattern 120a is left as is.

In this etching, fine treatment is possible. Furthermore, both the offset insulating film pattern 120a and the p type epitaxial layer 119, which is the ground of the insulating film pattern 120a, can select etching properties, so the p type epitaxial layer 119 used as a base layer is prevented from over-etching. Thus, a shallow base layer can be formed in the stable state from the p type epitaxial layer 119.

After this, an n+ type deep impurity area 142 is formed near the boundary between the n type embedded layer 112 and the n type epitaxial layer 113 under the p type epitaxial layer 119 used as a base layer by ion implantation.

Subsequently, the fifth process is started. In this process, an oxidized silicon film is formed on the object using the CVD method to form a side wall insulating film all over the object. Then, the oxidized silicon film is etched back to form a side wall insulating film 125 on the side wall of the emitter opening 124.

Figure 6D:
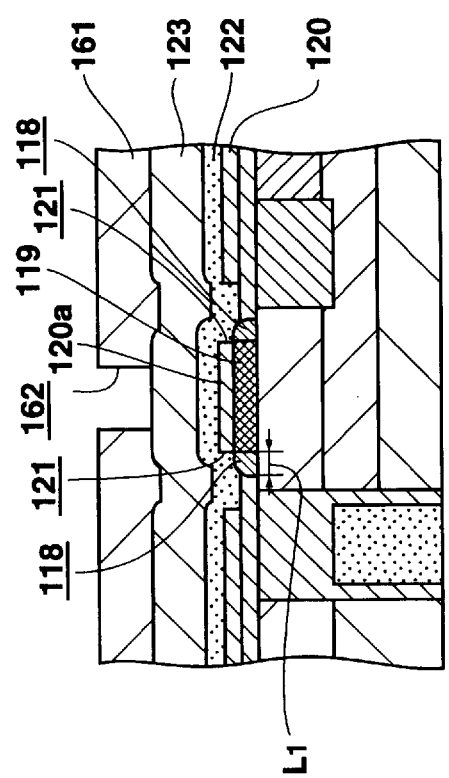

Subsequently, as shown in FIG. 6D, a polysilicon layer 127 is formed at least inside the emitter opening 124 using, for example, the CVD method. Then, n type impurities are implanted into the polysilicon layer 127 by ion implantation. After this, an n+ type emitter layer 129 is formed by diffusion of impurities from the n type polysilicon layer 127 executed by thermal treatment. At the same time, impurities from the p+ type graft base layer 128 are diffused further deeply in the layer formed on the n type epitaxial layer 113. The above thermal treatment may be an [RTA (Rapid Thermal Annealing)], for example within a heating temperature range of 900 to 1100° C. for a few seconds to a few tens of seconds.

The above thermal treatment may also be annealing by light exposure such as lamp annealing, excimer laser annealing.

The subsequent processes will be explained without using any drawing.

At first, contact holes used as collector and base outputs are formed. Then, base electrodes, emitter electrodes, and collector electrodes are formed to finish the manufacturing of the bipolar transistor of this invention.

In forming of the polysilicon layer 127, the polysilicon layer 127 is formed with doping polysilicon using the CVD method, so diffusion can be made at low temperature. And, since the p+ type graft base layer 128 is formed by ion implantation before the polysilicon layer 127 is formed, a deep p+ type graft base layer 128 can be formed even under a low temperature diffusion condition.

In the third manufacturing method described above, a p+ type graft base layer 128 is formed deeply up to the layer formed on the n type epitaxial layer 113 by ion implantation into the polysilicon layer 122 and diffusion of impurities from the polysilicon layer 122, so the junction between the p+ type graft base layer 128 and the n type epitaxial layer 113 used as a collector area can be separated from the edge of the base opening 118. Thus, no pn junction is formed in the area where crystallinity of the p epitaxial layer 119 near the edge of the base opening 118 is deteriorated, preventing current leaks from a junction caused by bad crystallinity of the p type epitaxial layer 119. After the p type epitaxial layer 119 is formed, excessive thermal treatment is prevented, so n type impurities are not diffused in the n type epitaxial layer 113 to extend the p type area. Thus, a shallow junction p type base layer 126 can be formed in the p type epitaxial layer 119.

This invention can materialize a high performance bipolar transistor such way as described above.

Subsequently, another embodiment of this invention associated with the four manufacturing method will be described with reference to the manufacturing processes. In the drawings, the same codes are given to the same items as those in FIG. 6A through FIG. 6D, avoiding redundant explanation.

In the same way as explained in FIG. 6A, the first process is started to form an n+ type embedded layer 112 on a p type silicon substrate 111. Then, an n type epitaxial layer 113 is formed over the p type silicon substrate 111.

After this, an element separating area 114 is formed on the n type epitaxial layer 113 by selective non-isotropic etching and embedding an insulating film in the layer 113. The element forming area 115 is thus surrounded by this element separating area 114.

In the deep element separating area 114, a polysilicon layer 116 may be embedded.

Subsequently, first insulating film 117 is formed all over the above epitaxial layer 113 using the CVD method. The film 117 functions as an insulating film and a diffusion source of p type impurities. This first insulating film 117 is formed with an oxidized silicon film formed by doping of boron (B), for example, or by laminating an oxidized film formed by doping of boron (B) and an oxidized film in which no doping of impurities is carried out.

Especially when an epitaxial layer used as a base layer is formed, it should preferably be covered by an oxidized film into which no doping of impurities is carried out or with a nitrided silicon ($Si_3N_4$) film in order to prevent scattering of boron from the boron-doped oxidized silicon film to external.

Subsequently, a base opening 118 is formed in the element forming area 115 by removing the first insulating film 117 just as explained in FIG. 6A.

Subsequently, a p type epitaxial layer 119 is formed inside the base opening 118 by selective epitaxial growth. This p type epitaxial layer 119 is made of silicon (Si), germanium (Ge), silicon germanium ($Si_{1-x}Ge_x$), or the like in which, for example, P type impurities such as boron (B) are implanted. By using such an epitaxial growth method, a thin base layer can be formed at a low resistance and good controllability, providing a high performance bipolar transistor.

Furthermore, if germanium, silicon germanium, or the like is used for this epitaxial layer 119, a narrow band gap base can be materialized, enabling emitter implantation efficiency to be more improved, as well as base resistance to be reduced significantly.

In the above epitaxial growth, a p+ type graft base layer 128 is formed so that it may be positioned both on the p type epitaxial layer 119 near the edge of the base opening 118 and on the n type epitaxial layer 113.

Otherwise, a p+ type graft base layer 128 may be formed on the n type epitaxial layer 113 near the edge of the base opening 118 by thermal treatment carried out before the p type epitaxial layer 119 is formed.

If an oxidized film is selected as first insulating film 117, it is formed selectively only on the n type epitaxial layer 113. No epitaxial layer is grown in the epitaxial growth in this case. Thus, the surface can be flattened.

After this, the same process as that explained in FIG. 6B and FIG. 6C is started. No treatment is added to the process in FIG. 6B and FIG. 6C.

Figure 7A:
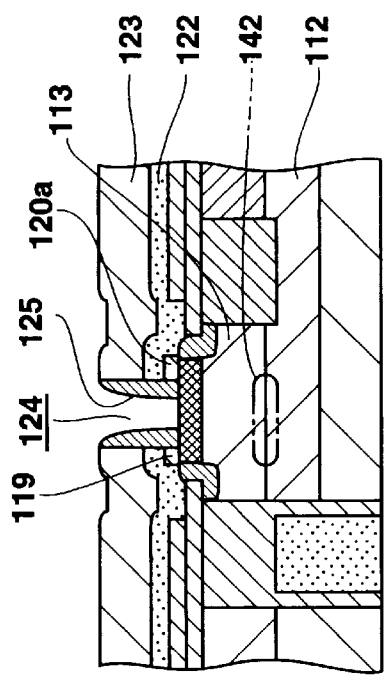
FIG. 7A through FIG. 7D illustrate manufacturing processes relating to the fourth manufacturing method of this invention.
Figure 7C:
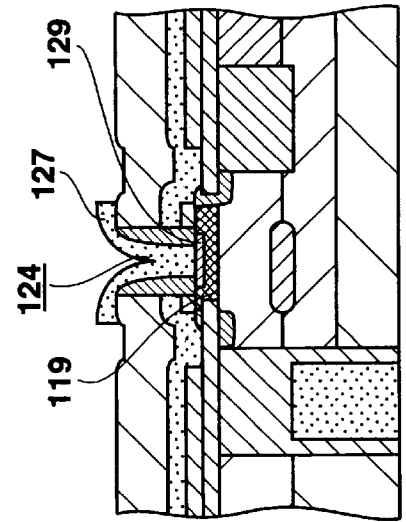
Figure 7B:
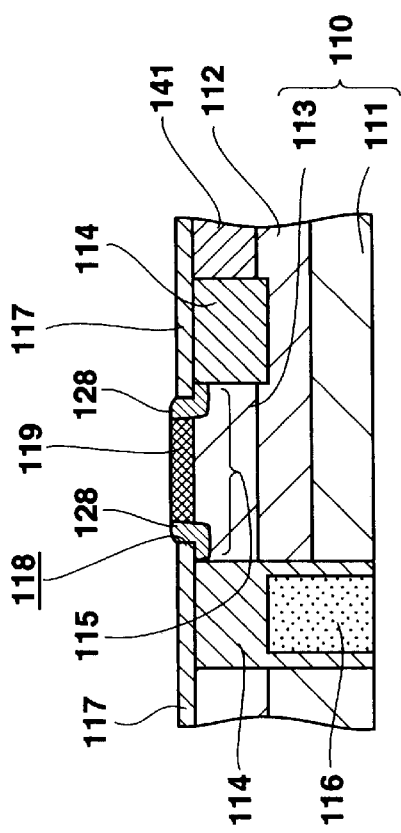

In other words, the second process is started as shown in FIG. 7B. In this process, an insulating film 120 is formed all over the object using the CVD method. Then, an opening for connection 121 is formed on the insulating film 120, covering the p type epitaxial layer 119, by lithography and etching technologies. At this time, an offset insulating film 120a is formed on the p type epitaxial layer 119 from the insulating film 120.

The opening for connection 121 is thus extended by a width of $L_1$ from the edge of the base opening 118 toward the p type epitaxial layer 119.

Subsequently, a polysilicon layer 122 is formed all over the subject using, for example, the CVD method. This polysilicon layer 122 functions as a base output electrode and covers the insulating film 120 on which the opening for connection 121 is formed. At the bottom of the opening 121, the polysilicon layer 122 is connected to the surface of the p type epitaxial layer.

Subsequently, the third process is started. In this process, p type impurities are implanted into the polysilicon layer 122 by ion implantation. At this time, p type impurities may also be implanted deeply into the p type epitaxial layer 119 in the area specified by a distance of $L_1$ by optimizing the condition for ion implantation.

In the above ion implantation, the offset insulating film pattern 120a is used as a mask, so no impurities are implanted into the p type epitaxial layer 119 covered with the insulating film 120. Distribution of impurities in the p type epitaxial layer 119 formed by epitaxial growth is thus kept as is.

After this, the p type polysilicon layer 122 is patterned by lithographic technology and dry-etching technology.

Subsequently, the third process is started. In this process, the second insulating film 123 is formed all over the surface of the object with an oxidized silicon film using the CVD method.

After this, a resist film 125 is formed by lithographic technology to form an opening 162 through the resist film 161. The opening 126 is formed in the upper portion inside the offset insulating film pattern 120a on the p type epitaxial layer 119. For example, the opening 126 is away from the end of the offset insulating film pattern 120a by a width of $L_2$.

Subsequently, as shown in FIG. 7C, an emitter opening 124 is formed through the second insulating film 123, the polysilicon layer 122, and the offset insulating film pattern 120a by non-isotropic etching using the resist film 161 as a mask. This emitter opening 124 is formed by copying the shape of the opening 162. In this etching, both the offset insulating film pattern 120a and the p type epitaxial layer 119, which is the ground of the insulating film pattern 120a, can select etching properties, so the p type epitaxial layer 119 used as a base layer is prevented from over-etching. Thus, a shallow base layer can be formed in the stable state from the p type epitaxial layer 119.

After this, an n+ type deep impurity area 142 is formed near the boundary between the n type embedded layer 112 and the n type epitaxial layer 113 under the p type epitaxial layer 119 used as a base layer by ion implantation.

Subsequently, the fourth process is started. In this process, an oxidized silicon film is formed using the CVD method to form a side wall insulating film all over the object. Then, the oxidized silicon film is etched back to form a side wall insulating film 125 on the side wall of the emitter opening 124.

Figure 7D:
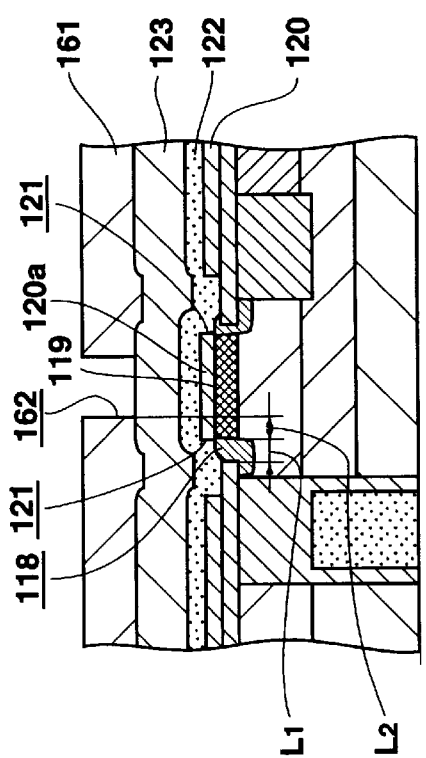

Subsequently, as shown in FIG. 7D, a polysilicon layer 127 is formed at least inside the emitter opening 124 using, for example, the CVD method. Then, n type impurities are implanted into the polysilicon layer 127 by ion implantation. After this, an n+ type emitter layer 129 is formed by diffusion of impurities from the n type polysilicon layer 127 executed by thermal treatment.

The above thermal treatment may be an [RTA (Rapid Thermal Annealing)], for example, within a heating temperature range of 900 to 1100° C. for a few seconds to a few tens of seconds.

The above thermal treatment may also be annealing by light exposure such as lamp annealing, excimer laser annealing.

The subsequent processes will be explained without using any drawing.

At first, contact holes used as collector and base outputs are formed. Then, base electrodes, emitter electrodes, and collector electrodes are formed to finish the manufacturing of the bipolar transistor of this invention.

In the fourth manufacturing method described above, a p+ type graft base layer 128 is formed deeply in the p type epitaxial layer 119 near the edge of the base opening 118 and up to the surface of the n type epitaxial layer 113 by solid phase diffusion of impurities from the first insulating film 117 just like in the third manufacturing method, so the junction between the p+ type graft base layer 128 and the n type epitaxial layer 113 used as a collector area can be separated from the edge of the base opening 118. Thus, no pn junction is formed at the portion where crystallinity of the p epitaxial layer 119 near the edge of the base opening 118 is deteriorated, preventing current leaks from a junction formed where crystallinity of the p type epitaxial layer 119 is deteriorated. After the p type epitaxial layer 119 is formed, excessive thermal treatment is prevented, so n type impurities are not diffused in the n type epitaxial layer 113 to extend the p type area. Thus, a shallow junction p type base layer 126 can be formed in the p type epitaxial layer 119.

This invention can thus materialize a high performance bipolar transistor.

In each of the above embodiments, since the polysilicon layer 127 is formed with doping polysilicon using the CVD method, diffusion can be made at low temperature. And, since the p+ type graft base layer 128 is formed by ion implantation before the polysilicon layer 127 is formed, a deep p+ type graft base layer 128 can be formed even under a low temperature diffusion condition.

Consequently, the junction between the p+ type graft base layer 128 and the n type epitaxial layer 113 used as a collector area can be separated from the edge of the base opening 118, so that junction leak caused by deterioration of crystallinity of the epitaxial layer 119 at the edge of the base opening 118 can be prevented, as well as a shallow junction p type base layer 126 (p type epitaxial layer 119) can be formed, materializing a high performance bipolar transistor 101.

Figure 8:
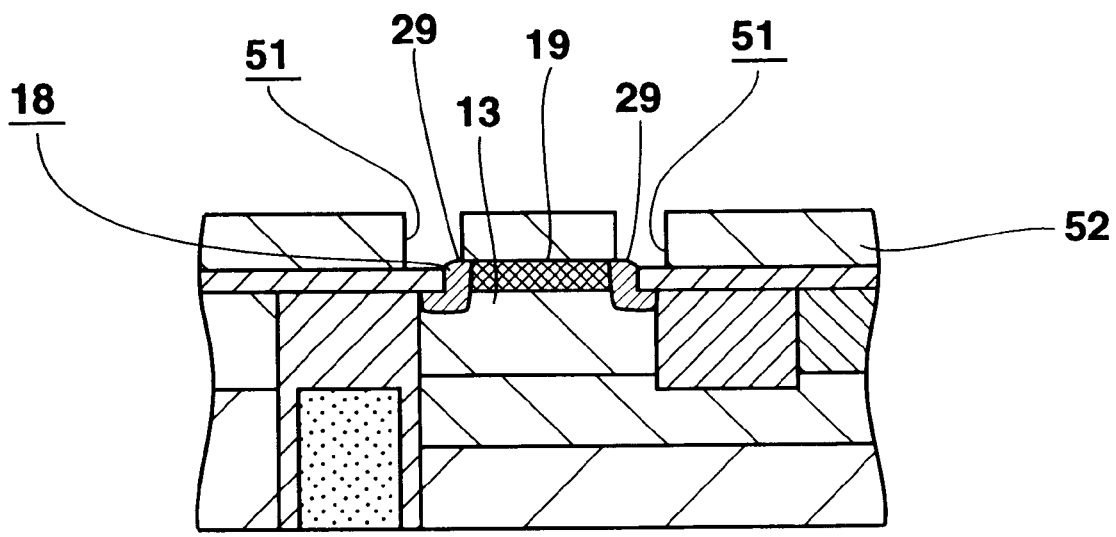
FIG. 8 shows a modification of the fourth manufacturing method of this invention.

Subsequently, a variation of the four manufacturing method will be described with reference to FIG. 8. In FIG. 8, for the same items as those in FIG. 7A through FIG. 7D will be given same codes, avoiding redundant explanation.

As shown in FIG. 8, a p type epitaxial layer 119 is formed in the base opening 118 described above. Then, a mask 152 is formed near the edge of the base opening 118. The mask is provided with an opening 151. The mask 152 is then used for ion implantation of p type impurities to form a p+ graft base layer 128 so that the layer 128 may be positioned both on the p type epitaxial layer 119 and on the n type epitaxial layer 113 formed below the epitaxial layer 119.

Thus, a p+ type graft base layer 128 can be formed even by ion implantation just like in the fourth manufacturing method.

As explained above, in the bipolar transistor of this invention, a graft base layer is formed to be positioned both on the epitaxial layer near the edge of the base opening and on the first semiconductor layer, so the portion near the edge of the base opening where crystallinity of the epitaxial layer is deteriorated becomes a graft base layer. Thus, it can be avoided to place a pn junction at a portion where crystallinity of the epitaxial layer is to be deteriorated. Instead, the pn junction can be placed in an area where good crystallinity can be assured for the epitaxial layer.

Furthermore, if any dummy patterns are formed in a structure, the surface of the second insulating film is flattened, so multiple-layer wiring can be formed easily on the second insulating film.

According to any of the manufacturing methods of this invention, the second conduction type impurities are implanted into both the epitaxial layer and the first semiconductor layer selectively by ion implantation to form a graft base layer, so the graft base layer can be formed to be positioned both on the epitaxial layer near the edge of the base opening and on the first semiconductor layer. Consequently, the portion near the edge of the base opening where crystallinity of the epitaxial layer is deteriorated becomes a graft base layer. This makes it possible to form a pn junction with an emitter in an area of the epitaxial layer where good crystallinity is assured.

Furthermore, since a base layer is formed with an epitaxial layer, a shallow junction base layer can be formed.

This invention can therefore materialize a high performance bipolar transistor as described above.

Furthermore, according to a manufacturing method for forming a dummy pattern made of the same film as that of the offset insulating film on the first oxidized film around a base output electrode formed by patterning an epitaxial layer when forming an offset insulating pattern, the difference in level made by the base output electrode is reduced, so that the surface of the second insulating film to be formed later is flattened. Thus, multiple-layer wiring can be formed easily on the second insulating film.

Furthermore, according to this invention, second conduction type impurities are implanted into both the second semiconductor layer and the epitaxial layer by ion implantation using an offset insulating film as a mask, as well as the impurities in the epitaxial layer are diffused in the first semiconductor layer below the epitaxial layer to form a graft base layer, so the graft base layer can be formed to be positioned both on the epitaxial layer near the edge of the base opening and on the first semiconductor layer. Thus, the portion near the edge of the base opening, where crystallinity of the epitaxial layer is deteriorated becomes a graft base layer and positioning of a pn junction in such an area can be avoided, preventing junction leaks to be caused by deterioration of crystallinity.

Furthermore, according to this invention, second conduction type impurities are implanted into both epitaxial layer near the edge of the base opening and into the first semiconductor layer below the epitaxial layer by solid phase diffusion of impurities from the first insulating film to form a graft base layer, so the graft base layer can be formed to be positioned both on the epitaxial layer near the edge of the base opening and on the first semiconductor layer. And, as defined in claim 4 of this invention, a mask provided with an opening is formed near the edge of the base opening, and the mask is used for ion implantation of impurities into both the epitaxial layer near the edge of the base opening and the first semiconductor layer below the epitaxial layer to form a graft base layer, so the graft base layer can be formed to be positioned both on the epitaxial layer near the edge of the base opening and on the first semiconductor layer.

Consequently, the area near the edge of the base opening where crystallinity of the epitaxial layer is deteriorated becomes a graft base layer and no pn junction is positioned in the area. As a result, junction leak to be caused by deterioration of crystallinity can be avoided.

What is claimed is:

1. A bipolar transistor comprising:

a first semiconductor layer of first conduction type used as a collector;

a first insulating film formed on said first semiconductor layer and provided with a base opening in an area where a base layer is formed;

an epitaxial layer of second conduction type formed both inside said base opening and on said first insulating film, said epitaxial layer being a base layer inside said base opening and a base output electrode on said first insulating film;

an offset insulating film pattern formed on said epitaxial layer in said base opening, away from the edge of said base opening;

a graft base layer of second conduction type formed both in said epitaxial layer and on said first semiconductor layer near the edge of said base opening;

a second insulating film formed to cover said epitaxial layer and said offset insulating film pattern;

an emitter opening formed so that it reaches the surface of said epitaxial layer through both said second insulating film and said offset insulating film pattern;

an emitter output electrode of first conduction type formed in said emitter opening so as to be connected to said epitaxial layer; and an emitter layer of first conduction type formed on an upper layer of said epitaxial layer to which said emitter output electrode is connected.

2. A bipolar transistor as defined in claim 1, wherein said epitaxial layer is made of $Si_{1-x}Ge_x$.

3. A bipolar transistor as defined in claim 1, wherein a dummy pattern comprising an insulating film is formed on said first insulating film around said base output electrode comprising said epitaxial layer of second conduction type.

4. A bipolar transistor as set forth in claim 1, wherein said graft base layer is formed by ion implantation.

5. A bipolar transistor as set forth in claim 1, wherein said first insulating layer includes an impurity of said second conduction type.

6. A bipolar transistor, comprising:

a first semiconductor layer of a first conduction type forming a collector;

a first insulating film formed on said first semiconductor layer and provided with a base opening in an area where a base layer is formed;

an epitaxial layer of a second conduction type formed both inside said base opening and on said first insulating film, said epitaxial layer being a base layer inside said base opening and base output electrode on said first insulating film;

a graft base layer of said second conduction type formed both in said epitaxial layer and on said first semiconductor layer near an edge of said base opening, said graft base layer being formed by ion implantation;

a second insulating film formed so as cover said epitaxial layer;

an emitter opening formed so that it extends to an upper surface of said epitaxial layer through said second insulating film;

an emitter output electrode of said first conduction type formed in said emitter opening so as to be connected to said epitaxial layer;

an emitter layer of said first conduction type formed on an upper layer of said epitaxial layer to which said emitter output electrode is connected.

7. A bipolar transistor as set forth in claim 6 wherein said epitaxial layer is made of Si Ge.

8. A bipolar transistor as set forth in claim 6 wherein a dummy pattern comprising an insulating film is formed on said first insulating film around said base output electrode comprising said epitaxial layer of said second conduction type.

9. A bipolar transistor as set forth in claim 6 wherein said first insulating film includes an impurity of said second conduction type.

* * * * *